United States Patent
Tsai et al.

(10) Patent No.: US 9,001,014 B2
(45) Date of Patent: Apr. 7, 2015

(54) DISPLAY WITH BLACK MATRIX

(71) Applicant: InnoLux Corporation, Miao-Li County (TW)

(72) Inventors: Chia-Hao Tsai, Miao-Li County (TW); Chih-Lung Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 92 days.

(21) Appl. No.: 13/928,133

(22) Filed: Jun. 26, 2013

(65) Prior Publication Data

US 2014/0002333 A1 Jan. 2, 2014

(30) Foreign Application Priority Data

Jun. 28, 2012 (TW) .............................. 101123183 A

(51) Int. Cl.
*G09G 3/36* (2006.01)
*G09G 3/20* (2006.01)

(52) U.S. Cl.
CPC .................................. *G09G 3/2003* (2013.01)

(58) Field of Classification Search
CPC ......... G09G 3/20; G09G 3/2003; G09G 3/36; G09G 3/3607; G09G 5/06
USPC .............................. 345/87–100, 204–215, 690
See application file for complete search history.

(56) References Cited

U.S. PATENT DOCUMENTS

| | | | |
|---|---|---|---|
| 2013/0169899 A1* | 7/2013 | Tsuda et al. | ..................... 349/42 |
| 2014/0184661 A1* | 7/2014 | Tsuda | ........................... 345/690 |

* cited by examiner

*Primary Examiner* — Vijay Shankar
(74) *Attorney, Agent, or Firm* — Muncy, Geissler, Olds & Lowe, P.C.

(57) ABSTRACT

An embodiment of the present invention provides a display including: a first substrate; gate lines and data lines defining a first color, second color, and third color pixel area; a first color, second color, and third color pixel transistor located in the first color, second color, and third color pixel area respectively; a second substrate; and a black matrix, wherein the black matrix has a first portion and a second portion, and the first portion extends from an edge of a first color pixel active layer for a first shading distance, the second portion extends from an edge of a third pixel active layer for a second shading distance larger than the first shading distance.

20 Claims, 8 Drawing Sheets

DISPLAY WITH BLACK MATRIX

CROSS REFERENCE TO RELATED APPLICATIONS

This Application claims priority of Taiwan Patent Application No. 101123183 filed on Jun. 28, 2012, the entirety of which is incorporated by reference herein.

BACKGROUND OF THE INVENTION

1. Field of the Invention

The present invention relates to a display, and in particular relates to a display with a color filter array.

2. Description of the Related Art

Liquid-crystal displays have many advantages, such as lightness, thinness, and low power consumption, so liquid-crystal displays have become mainstream displays. The liquid-crystal display includes a liquid-crystal display panel. The liquid-crystal display panel includes a thin-film transistor substrate, a color filter substrate, and a liquid-crystal layer sandwiched therebetween.

The color filter substrate has a substrate and a color filter layer formed thereon, and the color filter layer is composed of a plurality of red, green, and blue pixels and a black matrix separating the pixels from each other. The black matrix can prevent thin-film transistors from being exposed to light (the thin-film transistors exposed to light may produce a current leakage, which adversely affects image quality). The black matrix can prevent color mixture between adjacent pixels and can improve contrast.

With the progress in technologies for manufacturing displays, each unit pixel area has shrunk to improve image quality. However, as the unit pixel area shrinks, the ratio of the black matrix to the unit pixel area increases, which substantially decreases the aperture ratio of the pixel.

BRIEF SUMMARY OF THE INVENTION

An embodiment of the invention provides a display which includes: a first substrate; a plurality of gate lines and a plurality of data lines disposed on the first substrate and crossing with each other to define at least one first color pixel area, at least one second color pixel area, and at least one third color pixel area; a first color pixel transistor, a second color pixel transistor, and a third color pixel transistor respectively located in the first color pixel area, the second color pixel area, and the third color pixel area, and electrically connected to the corresponding gate lines and the corresponding data lines, wherein the first color pixel transistor comprises a first color pixel active layer, the second color pixel transistor comprises a second color pixel active layer, and the third color pixel transistor comprises a third color pixel active layer; a second substrate disposed on the first substrate; and a black matrix disposed between the first substrate and the second substrate and corresponding to the gate lines and the data lines, wherein the black matrix has a first portion covering the first color pixel transistor and a second portion covering the third color pixel transistor, and the first portion extends a first shading distance from an edge of the first color pixel active layer in a direction perpendicular to the gate lines, the second portion extends a second shading distance from an edge of the third color pixel active layer in the direction, wherein the second shading distance is larger than the first shading distance, and the first color has a wavelength longer than that of the third color.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

The present invention improves the aperture ratio of the pixels by narrowing the black matrix. The design principle is illustrated as follows.

Figure 1:
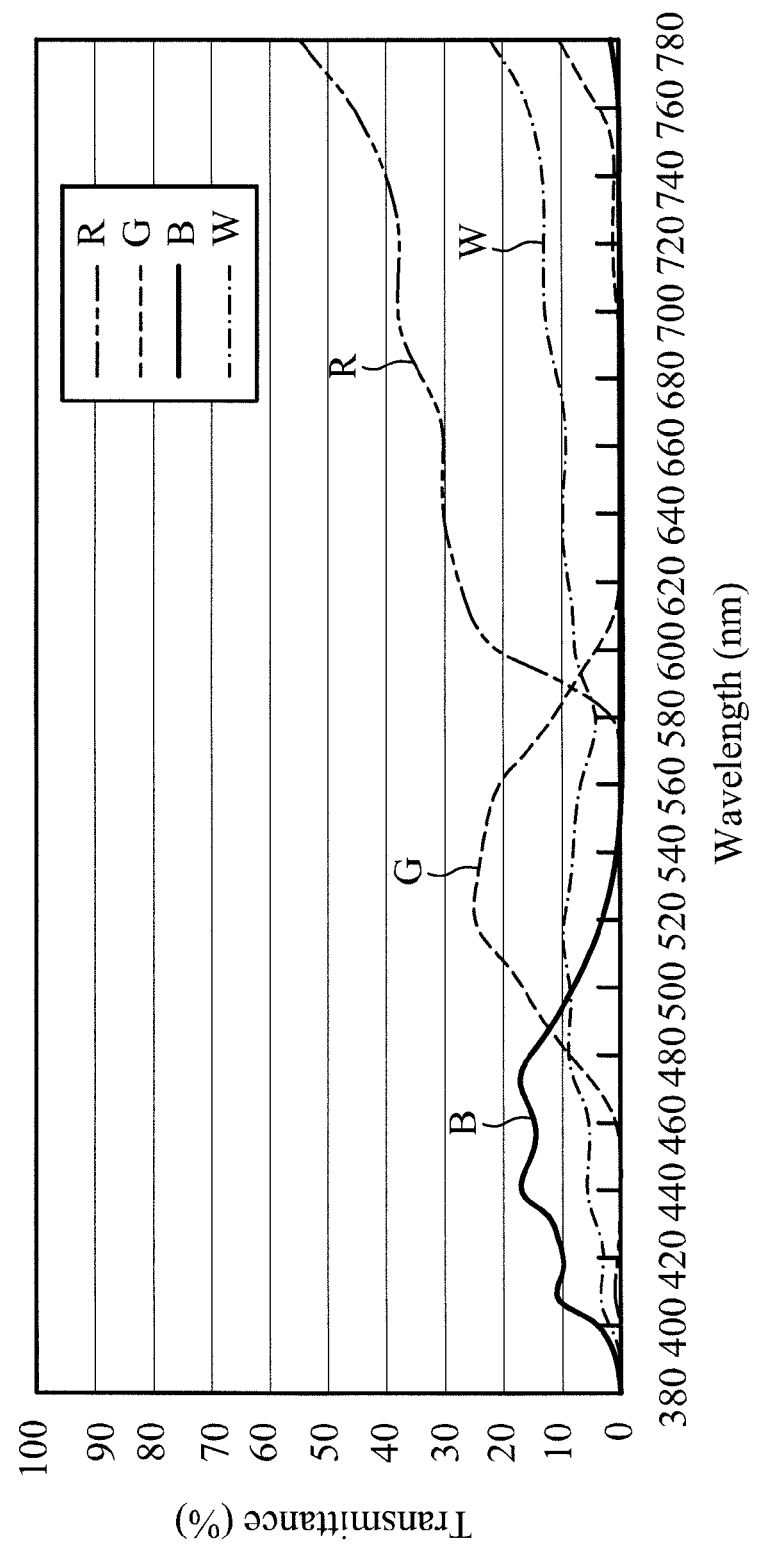
FIG. 1 is a relation curve of various wavelengths of red light, blue light, green light and white light transmitting through a display and corresponding transmittances, wherein the red light, the blue light and the green light are formed by irradiating the display with the white light and then filtering the white light with a color filter of the display.

FIG. 1 is a relation curve of various wavelengths of red light, blue light, green light and white light transmitting through a display and corresponding transmittances, wherein the red light, the blue light and the green light are formed by irradiating the display with the white light and then filtering the white light with a color filter of the display. Referring to FIG. 1, the transmittance represents the transmittance of a light transmitting through the upper substrate, the polarizing plate, the liquid crystal layer, etc. to irradiate the transistors of pixels with the corresponding color (i.e. the light intensity ratio of the light irradiating the transistors to the light just transmitting through the color filter). It can be known from FIG. 1 that, the red light with a wavelength less than 580 nm has a transmittance almost zero, the green light with a wavelength less than 460 nm has a transmittance almost zero, and the blue light with a short wavelength ranging from 560 nm to 380 nm has a transmittance which cannot be ignored.

Figure 2:
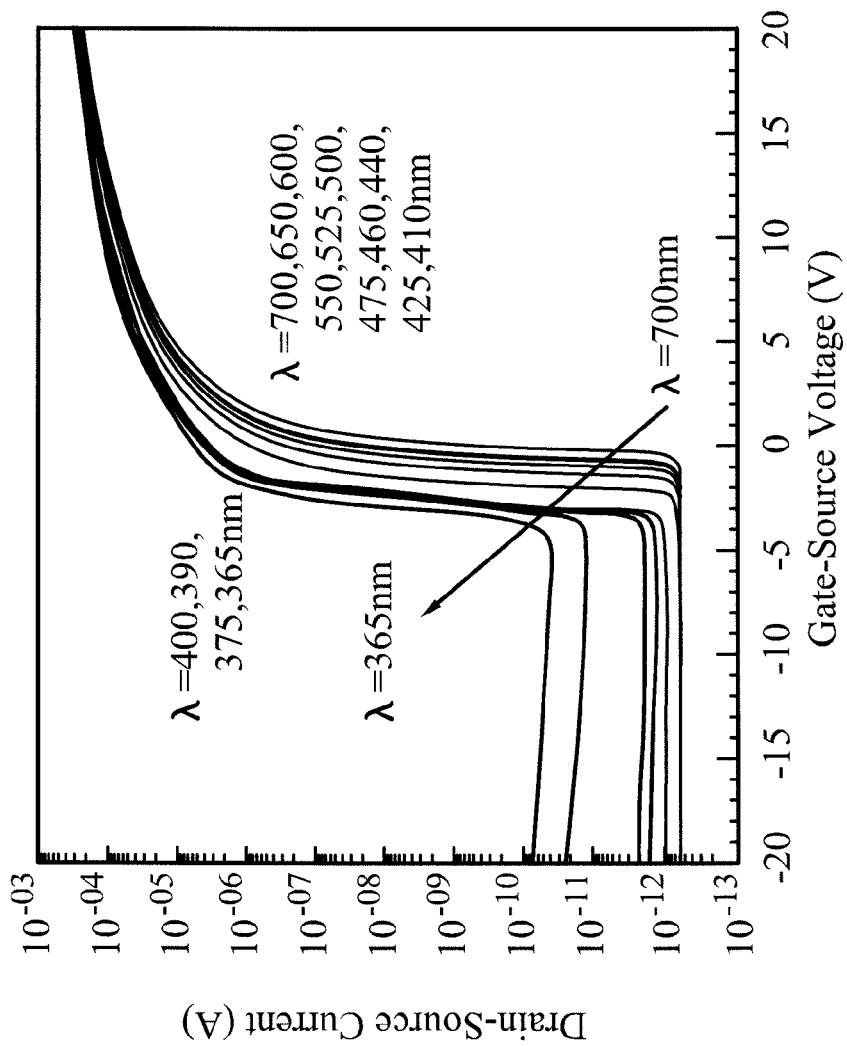
FIG. 2 is a relation curve of a gate-source voltage and a drain-source current of transistors irradiated by lights with different wavelengths, wherein the data is described by Kamiya T, Nomura K, and Hosono H in Sci. Technol. Adv. Mater. 11 044305 (2010)

FIG. 2 is a relation curve of a gate-source voltage and a drain-source current of transistors irradiated by lights with different wavelengths, wherein the data is described by Kamiya T, Nomura K, and Hosono H in Sci. Technol. Adv. Mater. 11 044305 (2010). The material of the active layers of the transistors tested is an In—Ga—Zn oxide. It can be known from FIG. 2 that if the active layers of the transistors are irradiated by the light with a wavelength less than about 420 nm, the threshold voltage of the transistors may shift quite substantially, and current leakage may occur.

Furthermore, it can be known from FIG. 1 that the red light irradiating the transistors of the red pixels and the green light irradiating the transistors of the green pixels have almost no light with the wavelength less than 420 nm (i.e. the red light with the wavelength less than 420 nm and the green light with the wavelength less than 420 nm have a transmittance almost zero), but the blue light with the wavelength about 420 nm has a transmittance about 10% during irradiating the transistors of the blue pixels. Thus, the portion of the black matrix corresponding to the red pixels not affected by the red light and the green pixels not affected by the green light may be narrowed down.

It should be known that, FIG. 2 shows a specific results, wherein the active layer includes an In—Ga—Zn oxide. When the active layer includes other materials, the wavelength of the light affecting the active layers of the transistors may change accordingly. For example, in other embodiments, only the light with a wavelength less than 580 nm can affect the transistors.

In this case, it can be known from FIG. 1 that the red light irradiating the transistors of the red pixels has almost no light with the wavelength less than 580 nm (i.e. the red light with the wavelength less than 580 nm has a transmittance almost zero), but the green light (irradiating the transistors of the green pixels) with the wavelength less than 580 nm and the blue light (irradiating the transistors of the blue pixels) with the wavelength less than 580 nm have a transmittance which cannot be ignored. Thus, the black matrix corresponding to the red pixels which are not affected by the red light may be narrowed down.

In other words, according to the material of the active layer, the black matrix corresponding to the pixels (e.g. the red pixels, or the red pixels and the green pixels) which are not affected by the incident light may be narrowed down to increase the aperture ratio of the pixels.

Figure 3A:
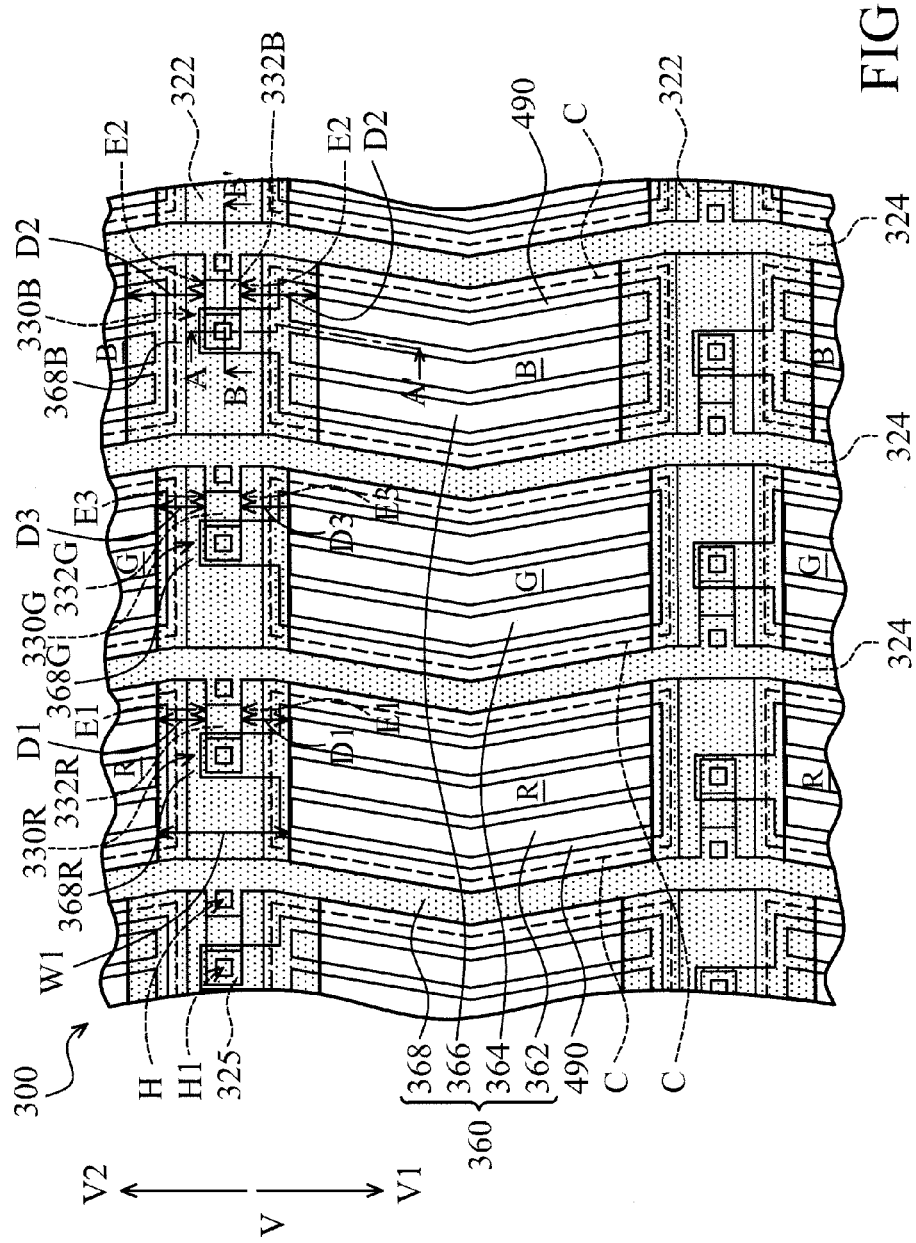
FIG. 3A shows a top view of a display according to an embodiment of the present invention.
Figure 3B:
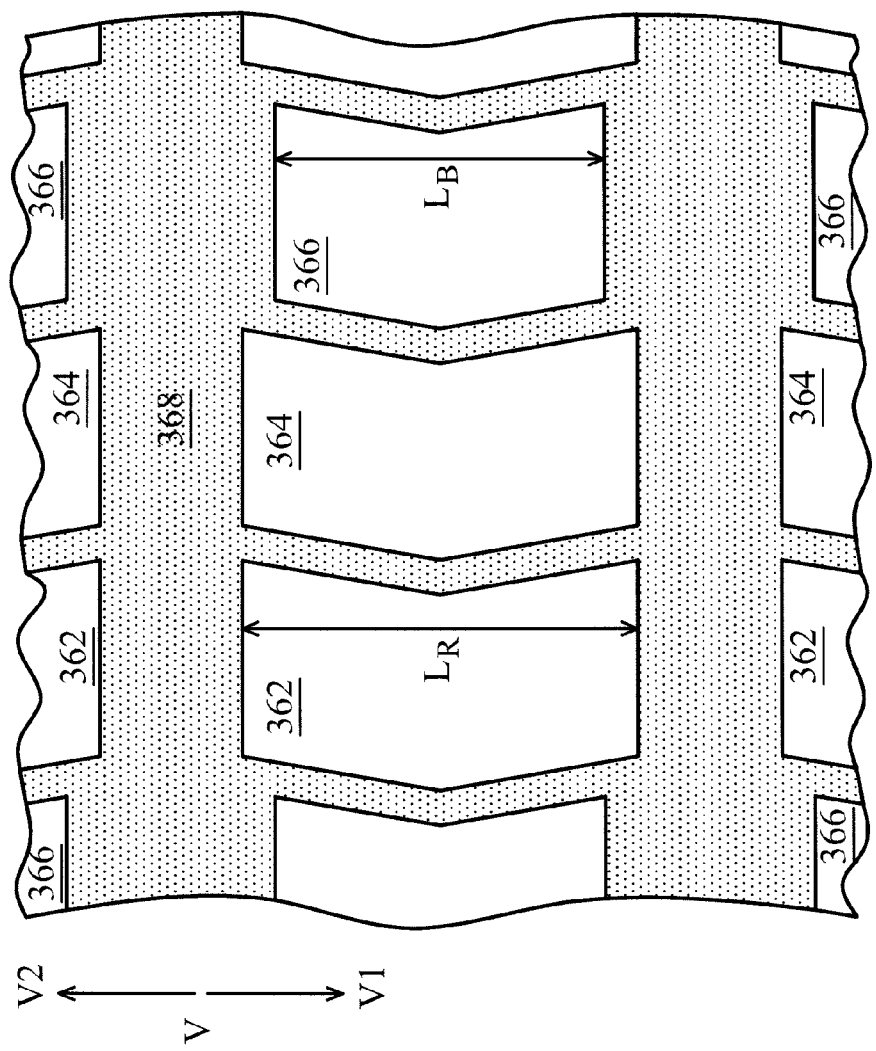
FIG. 3B shows a top view of the color filter array of FIG. 3A.
Figure 4A:
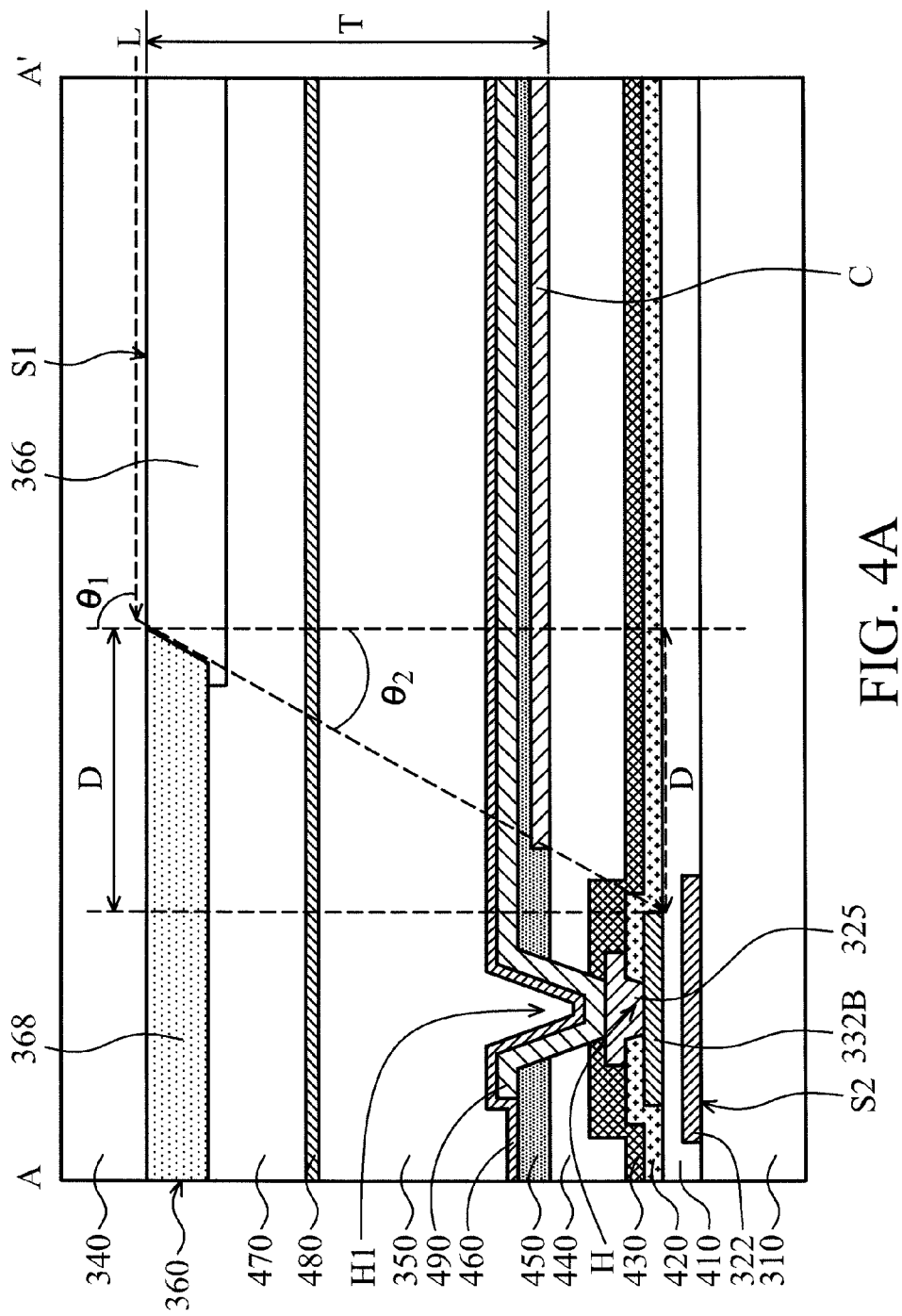
FIG. 4A is a cross-sectional view of the display along a sectional line A-A' in FIG. 3A.
Figure 5:
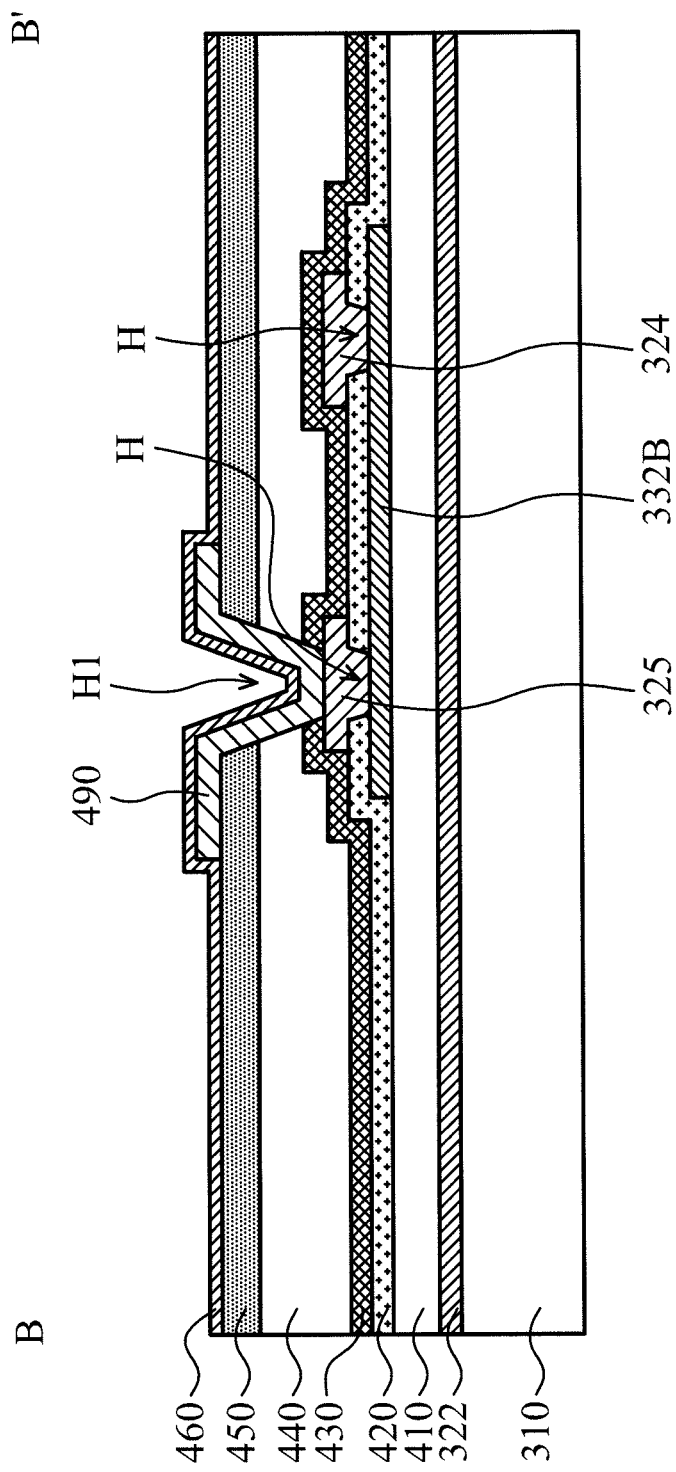
FIG. 5 is a cross-sectional view of the display along a sectional line B-B' in FIG. 3A.

FIG. 3A shows a top view of a display according to an embodiment of the present invention, and FIG. 3B shows a top view of the color filter array of FIG. 3A. FIG. 4A is a cross-sectional view of the display along a sectional line A-A' in FIG. 3A. FIG. 5 is a cross-sectional view of the display along a sectional line B-B' in FIG. 3A. It should be noted that, for the sake of simplicity, FIG. 3A omits a first substrate, a second substrate, a display medium and an insulating layer, and FIG. 5 omits the second substrate and the color filter array.

Referring to FIGS. 3A and 4A, in the present embodiment, a display 300 includes a first substrate 310, a plurality of gate lines 322, a plurality of data lines 324, a plurality of red pixel transistors 330R, a plurality of green pixel transistors 330G, a plurality of blue pixel transistors 330B, a second substrate 340, a display medium 350 and a color filter array 360.

Referring to FIG. 3A, the gate lines 322 and the data lines 324 are disposed on the first substrate 310, and the gate lines 322 and the data lines 324 are crossed to each other to define a plurality of red pixel areas R, a plurality of green pixel areas G and a plurality of blue pixel areas B. In the present embodiment, the gate lines 322 are parallel to each other, and the data lines 324 are parallel to each other. In the present embodiment, the pixel areas with the same color are arranged in the same column. In other embodiment, the pixel areas with the same color are arranged in different columns. For example, the pixel areas with the same color may be arranged in a checkerboard manner or other suitable arrangement manners.

Referring to FIG. 3A, the red pixel transistors 330R, the green pixel transistors 330G and the blue pixel transistors 330B are respectively located in the red pixel areas R, the green pixel areas G and the blue pixel areas B and electrically connected to the corresponding gate lines 322 and the corresponding data lines 324.

Referring to FIG. 4A, the second substrate 340 is disposed on the first substrate 310. The first substrate 310 and the second substrate 340 include transparent substrates, such as glass substrates or plastic substrates. The display medium 350 is disposed between the first substrate 310 and the second substrate 340. In one embodiment, the display medium 350 may be a liquid crystal layer, and the display 300 may be a liquid crystal display. In another embodiment, the display medium 350 may be an organic light emitting layer, and the display may be an organic light emitting diode display.

Referring to FIGS. 3A and 4A, the color filter array 360 is disposed between the first substrate 310 and the second substrate 340 and on the second substrate 340. The color filter array 360 includes a red filter film 362 corresponding to the red pixel areas R, a green filter film 364 corresponding to the green pixel areas G, a blue filter film 366 corresponding to the blue pixel areas B and a black matrix 368 corresponding to the gate lines 322 and the data lines 324.

Figure 4B:
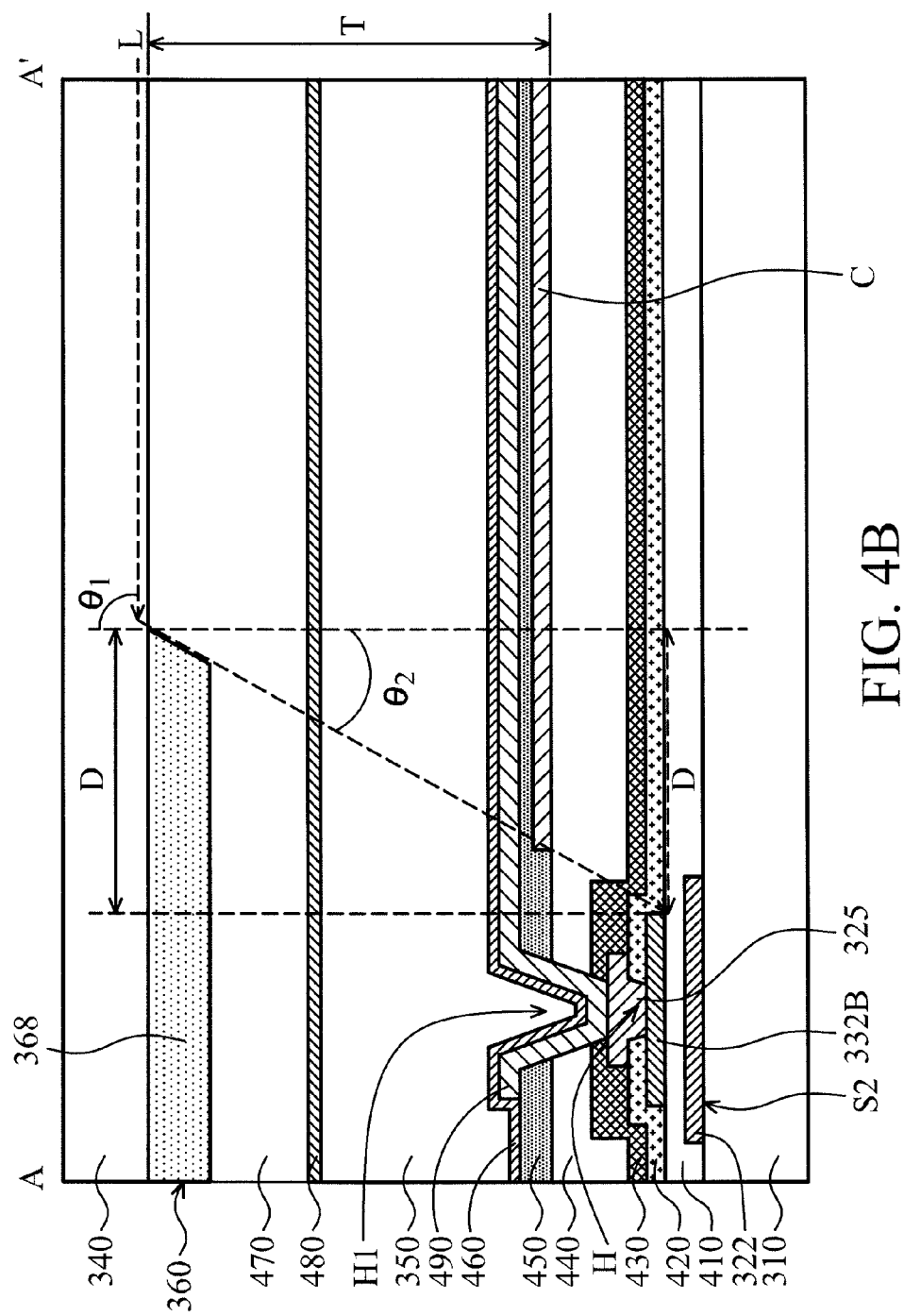
FIG. 4B is a cross-sectional view of a display according to another embodiment of the present invention.

FIG. 4B is a cross-sectional view of a display according to another embodiment of the present invention. As shown in FIG. 4B, in another embodiment, the black matrix 368 of the display 400B is disposed between the first substrate 310 and the second substrate 340 and located on the second substrate 340 and corresponding to the gate lines 322 and the data lines 324. It should be noted that the display 400B may include only the black matrix 368 and not include other filter films with other colors.

Referring to FIG. 3A, the black matrix 368 has a first portion 368R covering the red pixel transistors 330R, a second portion 368B covering the blue pixel transistors 330B and a third portion 368G covering the green pixel transistors 330G. The first portion 368R extends a first shading distance D1 from an edge E1 of a red pixel active layer 332R of the red pixel transistor 330R in a direction V perpendicular to the gate lines 322.

Specifically, in one embodiment, the direction V perpendicular to the gate lines 322 may include the direction V1 and/or the direction V2, wherein the directions V1 and V2 are opposite to each other. The first portion 368R may extend the first shading distance D1 from two opposite edges E1 of the red pixel active layer 332R in directions V1 and V2. The second portion 368B extends a second shading distance D2 from an edge E2 of a blue pixel active layer 332B of the blue pixel transistor 330B in the direction V, wherein the second shading distance D2 is larger than the first shading distance D1.

The first shading distance D1 ranges, for example, from 1.5 μm to 21.9 μm. The second shading distance D2 ranges, for example, from 1.6 μm to 22 μm. The difference between the second shading distance D2 and the first shading distance D1 may range, for example, from 0.1 μm to 20.5 μm. The ratio of the second shading distance D2 to the first shading distance D1 may range, for example, from 1.001 to 15. The first portion 368R has a width W1 ranging, for example, from 6 μm to 46.8 μm in the direction V.

Referring to FIGS. 3A and 3B, in one embodiment, in the direction V, the red filter film 362 has a length $L_R$ larger than the length $L_B$ of the blue filter film 366. In the direction V, the ration of the length $L_R$ of the red filter film 362 to the length $L_B$ of the blue filter film 366 may range, for example, from 1.01 to 3.5. In the direction V, the difference between the length $L_R$ of the red filter film 362 and the length $L_B$ of the blue filter film 366 may range, for example, from 0.2 μm to 41 μm. In one embodiment, the aperture ratio of the display 300 in the red pixel areas R may range from 21% to 96%. In one embodiment, the aperture ratio of the display 300 in the blue pixel areas B may range from 20% to 95%. For example, if the display 300 has a resolution of 264 ppi (pixels per inch), the aperture ratio of the display 300 in the red pixel areas R may be about 54.4%, and the aperture ratio of the display 300 in the blue pixel areas B may be about 49.6%. The ratio of the aperture area of the blue pixel areas B to the aperture area of the red pixel areas R may be about 0.2-0.99. It should be noted that, if the display has a high resolution, the black matrix may greatly affect the aperture ratio. That is to say, if the number of pixels per unit area is higher, the aperture ratio of the pixels is lower.

The third portion 368G extends a third shading distance D3 from an edge E3 of a green pixel active layer 332G in the direction V. In the present embodiment, the second shading distance D2 is lager than the third shading distance D3. In one embodiment, the first shading distance D1 is substantially equal to the third shading distance D3.

In the present embodiment, the red pixel active layer 332R, the blue pixel active layer 332B and the green pixel active layer 332G of the green pixel transistors 330G have a semiconductor material only affected by the light with a wavelength less than 420 nm. It should be noted that, the word "affect" means "affection to the electric properties of the semiconductor material". For example, as for a transistor with the semiconductor material, relative to the electric properties of a transistor which is not irradiated by the light, the transistor irradiated by the light with the wavelength has a threshold voltage shifting more than 3 V and/or has a current leakage more than $10^{-11}$ amp. The red pixel active layer 332R, the blue pixel active layer 332B and the green pixel active layer 332G have, for example, a semiconductor oxide (such as an In—Ga—Zn oxide).

It can be known from the above that, in the present embodiment, the active layer is composed of a semiconductor material only affected by the light with a wavelength less than 420 nm, and only the blue light has a wavelength less than 420 nm among the red light, the blue light and the green light. Thus, the black matrix 368 corresponding to the red pixel areas R, not affected by the red light, and the green pixel areas G, not affected by the green light, may be narrowed down to improve the aperture ratio of the red pixel areas R and the green pixel areas G.

Referring to FIGS. 3A and 4A, in one embodiment, the environment of the display 300 has a refractive index ($n_1$), the portion of the display 300 sandwiched between the second substrate 340 and the blue pixel active layer 332B has a refractive index ($n_2$) and a thickness (T). The second shading distance D2 is larger than the value D, as described in Formula (1):

$$D=\tan(\sin^{-1}(n_1/n_2))*T \quad \text{Formula (1)}$$

Referring to FIG. 4A, in Formula (1), there is a distance (i.e. the thickness T) between the light incident surface S1 of the color filter array 360 and the lower surface S2 of the blue pixel active layer 332B, and an external light L may enter the light incident surface S1 at an incident angle θ1, and then progress in the display 300 at an refractive angle θ2. Because the black matrix is required to completely shield the active layer from the light, it assumes that the incident angle θ1 is a largest incident angle (i.e. 90°). Formula (1) is derived by sequentially using the derivation Formulas (2), (3) and (4), as follows.

$$n_2*\sin(\theta_2)=n_1*\sin 90° \quad \text{Formula (2)}$$

$$\theta_2=\sin^{-1}(n_1/n_2) \quad \text{Formula (3)}$$

$$\tan(\sin^{-1}(n_1/n_2))=D/T \quad \text{Formula (4)}$$

$$D=\tan(\sin^{-1}(n_1/n_2))*T \quad \text{Formula (1)}$$

In one embodiment, the refractive index ($n_1$) is 1, the refractive index ($n_2$) is 1.566, the thickness T is 10.5 μm, and the value D is 8.77. If the second shading distance D2 is larger than the value D, the second shading distance D2 is equal to the sum of the value D and a process alignment error about 3 μm, and thus the second shading distance D2 is about 11.77 μm in the present embodiment.

Referring to FIGS. 3A, 3B, 4A and 5, specifically, in the present embodiment, a manufacturing method of the display 300 may include, for example: forming gate lines 322 on the first substrate 310; forming an insulating layer 410 on the first substrate 310 to cover the gate lines 322; forming red, blue and green pixel active layers 332R, 332B and 332G on the insulating layer 410; forming an insulating layer 420 on the insulating layer 410 to cover the red, blue and green pixel active layers 332R, 332B and 332G; forming a plurality of through holes H in the insulating layer 420 to expose the red, blue and green pixel active layers 332R, 332B and 332G; forming data lines 324 on the insulating layer 420, wherein the data lines 324 connect the red, blue and green pixel active layers 332R, 332B and 332G through the through holes H; forming a insulating layer 430 and 440 on the insulating layer 420; forming a plurality of common electrodes C on the insulating layer 440; forming an insulating layer 450 on the insulating layer 440 to cover the common electrodes C; forming a plurality of through holes H1 passing through the insulating layers 430, 440 and 450 and exposing the drain electrodes 325; forming a plurality of pixel electrodes 490 on the insulating layer 450, wherein the pixel electrodes 490 connect the drain electrodes 325 through the through holes H1 respectively, and a common electrodes C are located below the pixel electrodes 490; forming an insulating layer 460 on the insulating layer 450 to cover the pixel electrodes 490; sequentially forming a color filter array 360 and insulating layers 470ˋ480 on the second substrate 340; disposing the second substrate 340 on the first substrate 310, wherein the active devices and the passive devices described above are sandwiched between the second substrate 340 and the first substrate 310; and forming a display medium 350 between the second substrate 340 and the first substrate 310.

It should be noted that, during forming the color filter array 360, the black matrix may be designed according to the affection of the external light to the active layer in each pixel area and the shading distance corresponding to the active layer. In one embodiment, the direction V perpendicular to the gate lines 322 may include the direction V1 and/or the direction V2, wherein the directions V1 and V2 are opposite to each other. The first portion 368R may extend the first shading distance D1 from two opposite edges E1 of the red pixel active layer 332R in directions V1 and V2. The second portion 368B extends a second shading distance D2 from an edge E2 of a blue pixel active layer 332B in the direction V, wherein the second shading distance D2 is larger than the first shading distance D1.

Furthermore, the in-plane switching liquid crystal display (IPS-LCD) is described as an example in the present embodiment, and the present invention is not limited thereto. The present invention may be applied in various displays, such as a twisted nematic LCD (TN-LCD) or a vertical alignment LCD (VA-LCD).

Figure 6:
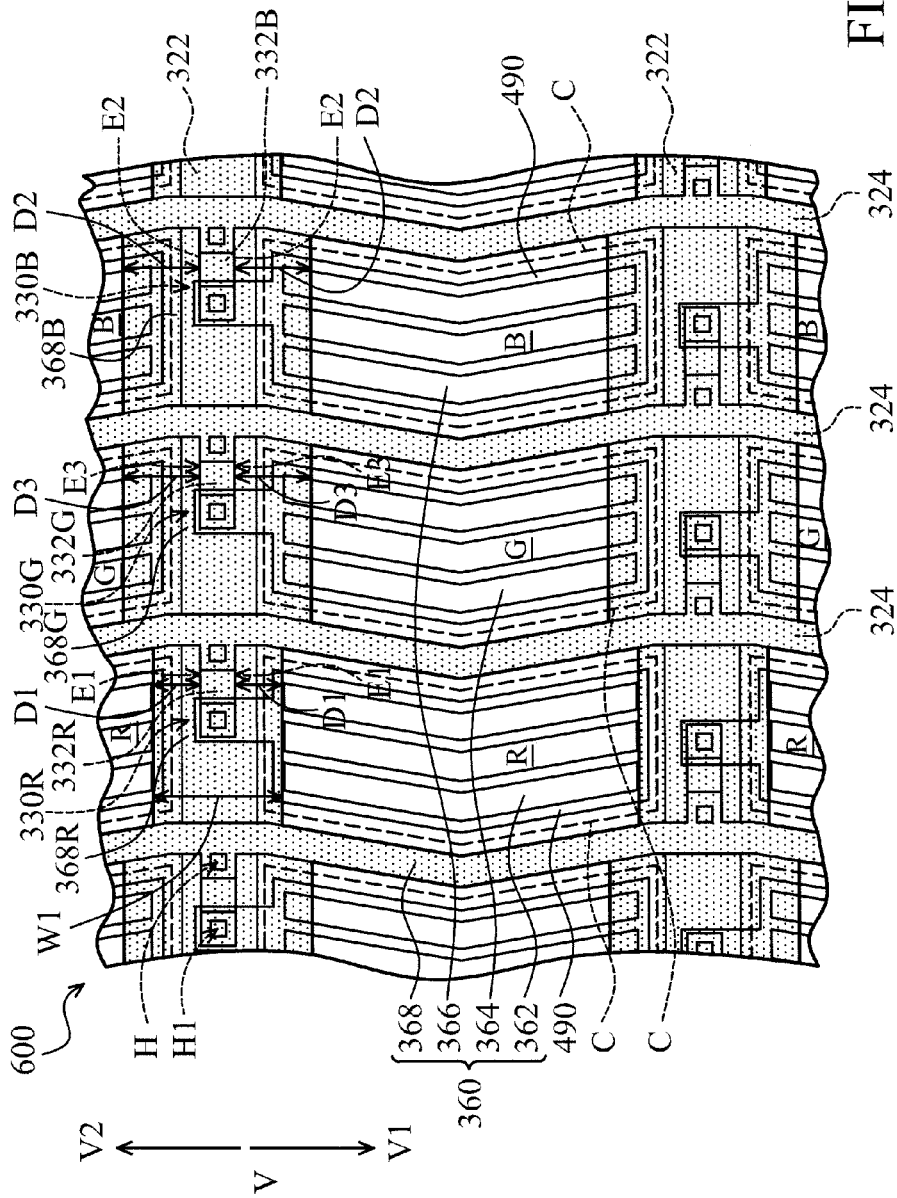
FIG. 6 is a top view of a display according to another embodiment of the present invention.

FIG. 6 is a top view of a display according to another embodiment of the present invention. It should be noted that, for the sake of simplicity, FIG. 6 omits the first substrate, the second substrate, the display medium and the insulating layer. The present embodiment is similar to that of FIG. 3 except that the third shading distance D3 of the display 600 of the present embodiment is larger than the first shading distance D1. That is, in the present embodiment, the portion of the black matrix 368 shading the green pixel active layer 332G is larger than the portion of the black matrix 368 shading the red pixel active layer 332R. In one embodiment, the second shading distance D2 is substantially equal to the third shading distance D3.

In one embodiment, the material of the red pixel active layer 332R, the blue pixel active layer 332B and the green pixel active layer 332G is a semiconductor material only affected by the light with a wavelength less than 580 nm.

In view of the above, in the present embodiment, the active layer is composed of a semiconductor material only affected by the light with a wavelength less than 580 nm, and only the blue light and the green light have a wavelength less than 580 nm among the red light, the blue light and the green light. Thus, only the second and the third shading distances D2 and D3 of the second and the third portions 368B and 368G of the black matrix 368 covering the blue and the green pixel transistors 330B and 330G are required to be increased to effectively prevent the transistors from the light. As such, the red pixel areas R, which are not affected by the light, may have a larger aperture ratio.

In view of the above, the present invention narrows down a portion of the black matrix corresponding to the pixels not affected by the light, such as the red pixel, to improve the aperture ratio of the pixels.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display, comprising:
    a first substrate;
    a plurality of gate lines and a plurality of data lines disposed on the first substrate and crossing with each other to define at least one first color pixel area, at least one second color pixel area, and at least one third color pixel area;
    a first color pixel transistor, a second color pixel transistor, and a third color pixel transistor respectively located in the first color pixel area, the second color pixel area, and the third color pixel area, and electrically connected to the corresponding gate lines and the corresponding data lines, wherein the first color pixel transistor comprises a first color pixel active layer, the second color pixel transistor comprises a second color pixel active layer, and the third color pixel transistor comprises a third color pixel active layer;
    a second substrate disposed on the first substrate; and
    a black matrix disposed between the first substrate and the second substrate and corresponding to the gate lines and the data lines,
    wherein the black matrix has a first portion covering the first color pixel transistor and a second portion covering the third color pixel transistor, and the first portion extends a first shading distance from an edge of the first color pixel active layer in a direction perpendicular to the gate lines, the second portion extends a second shading distance from an edge of the third color pixel active layer in the direction, wherein the second shading distance is larger than the first shading distance, and the first color has a wavelength longer than that of the third color.

2. The display as claimed in claim 1, wherein the first color is red and the third color is blue.

3. The display as claimed in claim 1, wherein the black matrix further has a third portion covering the second color pixel transistor, and the third portion extends a third shading distance from an edge of the second color pixel active layer in the direction, wherein the second shading distance is larger than the third shading distance.

4. The display as claimed in claim 3, wherein the first shading distance is substantially equal to the third shading distance.

5. The display as claimed in claim 3, wherein the first color pixel active layer, the second color pixel active layer and the third color pixel active layer have a semiconductor material affected by a light with a wavelength less than 420 nm.

6. The display as claimed in claim 5, wherein the first color pixel active layer, the second color pixel active layer and the third color pixel active layer have an In—Ga—Zn oxide.

7. The display as claimed in claim 1, wherein the black matrix further has a third portion covering the second color pixel transistor, and the third portion extends a third shading distance from an edge of the second color pixel active layer in the direction, wherein the third shading distance is larger than the first shading distance.

8. The display as claimed in claim 7, wherein the second shading distance is substantially equal to the third shading distance.

9. The display as claimed in claim 7, wherein the first color pixel active layer, the second color pixel active layer and the third color pixel active layer have a semiconductor material affected by a light with a wavelength less than 580 nm.

10. The display as claimed in claim 1, wherein the ratio of the second shading distance to the first shading distance ranges from 1.001 to 15.

11. The display as claimed in claim 1, wherein the first shading distance ranges from about 1.5 μm to 21.9 μm.

12. The display as claimed in claim 1, wherein the second shading distance ranges from 1.6 μm to 22 μm.

13. The display as claimed in claim 1, wherein the difference between the second shading distance and the first shading distance ranges from about 0.1 μm to 20.5 μm.

14. The display as claimed in claim 1, wherein the environment of the display has a refractive index ($n_1$), the portion of the display sandwiched between the second substrate and the third color pixel active layer has a refractive index ($n_2$) and a thickness (T), and the second shading distance is larger than a value D, as described in Formula (1):

$$D = \tan(\sin^{-1}(n_1/n_2)) * T \quad \text{Formula (1)}.$$

15. The display as claimed in claim 1, further comprising:
    a first color filter film corresponding to the first color pixel area;
    a second color filter film corresponding to the second color pixel area; and
    a third color filter film corresponding to the third color pixel area.

16. The display as claimed in claim 15, wherein a length of the first color filter film in the direction is larger than a length of the third color filter film in the direction.

17. The display as claimed in claim 15, wherein in the direction, the ratio of a length of the first color filter film to a length of the third color filter film ranges from 1.01 to 3.5.

18. The display as claimed in claim 15, wherein in the direction, the difference between a length of the first color filter film and a length of the third color filter film ranges from about 0.2 μm to 41 μm.

19. The display as claimed in claim 1, wherein the ratio of the aperture area of the third color pixel area to the aperture area of the first color pixel area ranges from 0.2 to 0.99.

20. The display as claimed in claim 1, wherein the first color pixel active layer, the second color pixel active layer and the third color pixel active layer have a semiconductor oxide.

\* \* \* \* \*